United States Patent
Saito et al.

(10) Patent No.: US 10,630,335 B2
(45) Date of Patent: Apr. 21, 2020

(54) WIRELESS CIRCUIT-MOUNTED ELECTRONIC APPARATUS

(71) Applicant: Murata Manufacturing Co., Ltd., Kyoto-fu (JP)

(72) Inventors: Kota Saito, Nagaokakyo (JP); Yoshihiro Imanishi, Nagaokakyo (JP); Hiroshi Kitada, Nagaokakyo (JP); Hiroyuki Takatsuji, Nagaokakyo (JP); Masashi Omuro, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 71 days.

(21) Appl. No.: 15/788,840

(22) Filed: Oct. 20, 2017

(65) Prior Publication Data

US 2018/0145716 A1 May 24, 2018

(30) Foreign Application Priority Data

Nov. 21, 2016 (JP) .................. 2016-225747

(51) Int. Cl.
*H04B 1/40* (2015.01)
*H04B 15/04* (2006.01)
*H03H 7/06* (2006.01)

(52) U.S. Cl.
CPC .............. *H04B 1/40* (2013.01); *H04B 15/04* (2013.01); *H03H 7/06* (2013.01)

(58) Field of Classification Search
CPC ... H03H 7/06; H03H 7/09; H04B 1/40; H04B 15/04
See application file for complete search history.

(56) References Cited

U.S. PATENT DOCUMENTS

| 4,608,572 A * | 8/1986 | Blakney | H01Q 1/48 343/792.5 |
| 7,804,188 B2 * | 9/2010 | Sakai | H04B 3/30 307/10.1 |

(Continued)

FOREIGN PATENT DOCUMENTS

| JP | H05-167376 A | 7/1993 |
| JP | H08-115820 A | 5/1996 |

(Continued)

OTHER PUBLICATIONS

An Office Action; "Notification of Reasons for Refusal," mailed by the Japanese Patent Office dated Apr. 16, 2019, which corresponds to Japanese Patent Application No. 2016-225747 and is related to U.S. Appl. No. 15/788,840; with English language translation.

*Primary Examiner* — David B Lugo
(74) *Attorney, Agent, or Firm* — Studebaker & Brackett PC

(57) ABSTRACT

A signal transmission and reception element transmits and receives a differential signal. Two transmission lines transmit the differential signal between the signal transmission and reception element and a connector. The signal transmission and reception element is connected to an external apparatus with the connector interposed therebetween. A noise generation source generates noise in a wireless band, which is coupled to the transmission lines. An antenna has a gain in a frequency band of the noise which is generated in the noise generation source. A wireless signal processing circuit processes a signal received by the antenna. An absorption-type filter that is mounted on the transmission lines absorbs noise mixed in the transmission lines.

20 Claims, 11 Drawing Sheets

(56) References Cited

U.S. PATENT DOCUMENTS

| | | | |
|---|---|---|---|
| 9,130,542 B1* | 9/2015 | Ishihara | H03H 11/126 |
| 9,190,978 B2* | 11/2015 | Takahashi | H03H 7/427 |
| 9,264,007 B2* | 2/2016 | Tamaki | H03H 1/0007 |
| 9,628,199 B1* | 4/2017 | Khasgiwala | H04B 15/02 |
| 2004/0070468 A1* | 4/2004 | Harada | H01P 1/20345 |
| | | | 333/185 |
| 2005/0168298 A1* | 8/2005 | Axelrod | G01R 31/31706 |
| | | | 333/12 |
| 2007/0252659 A1* | 11/2007 | Suenaga | H01F 17/0013 |
| | | | 333/32 |
| 2008/0036689 A1* | 2/2008 | Leisten | H01Q 1/242 |
| | | | 343/895 |
| 2012/0154076 A1* | 6/2012 | Liu | H03H 7/24 |
| | | | 333/81 R |
| 2012/0249257 A1* | 10/2012 | Takahashi | H03H 1/02 |
| | | | 333/12 |
| 2014/0378077 A1* | 12/2014 | Din | H04B 1/109 |
| | | | 455/197.3 |
| 2015/0261016 A1* | 9/2015 | Okada | G02F 1/0121 |
| | | | 359/245 |

FOREIGN PATENT DOCUMENTS

| | | |
|---|---|---|
| JP | H09-214276 A | 8/1997 |
| JP | 2009-135760 A | 6/2009 |
| JP | 2014-053765 A | 3/2014 |
| JP | 2015220476 A | 12/2015 |
| WO | 2006/040869 A1 | 4/2006 |

* cited by examiner

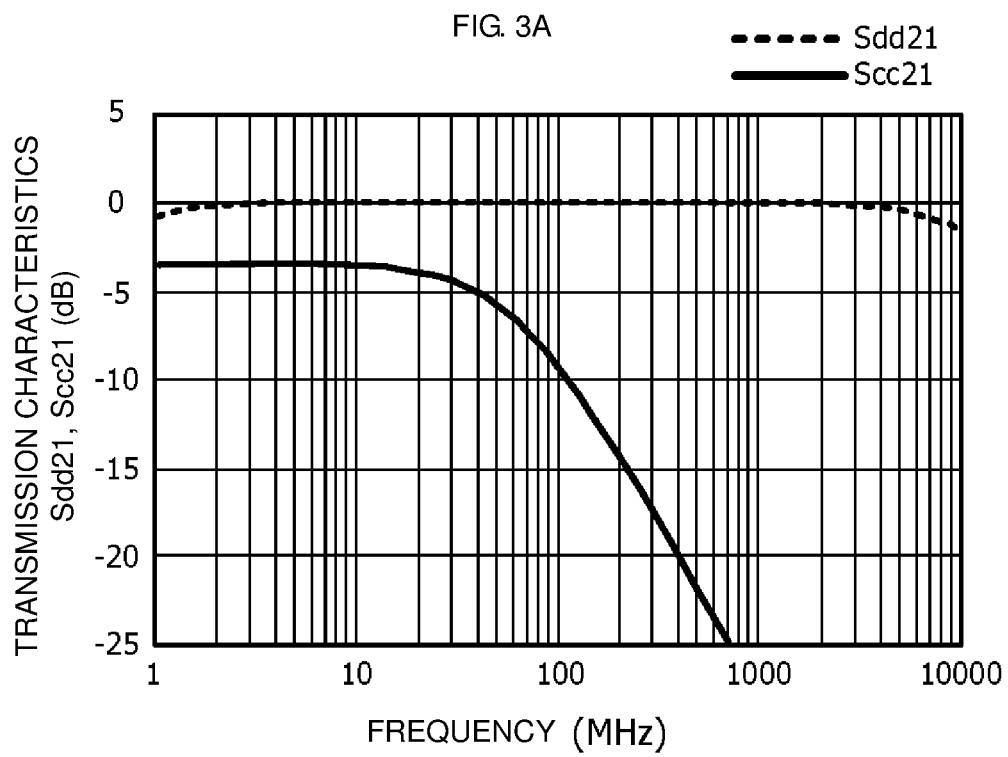
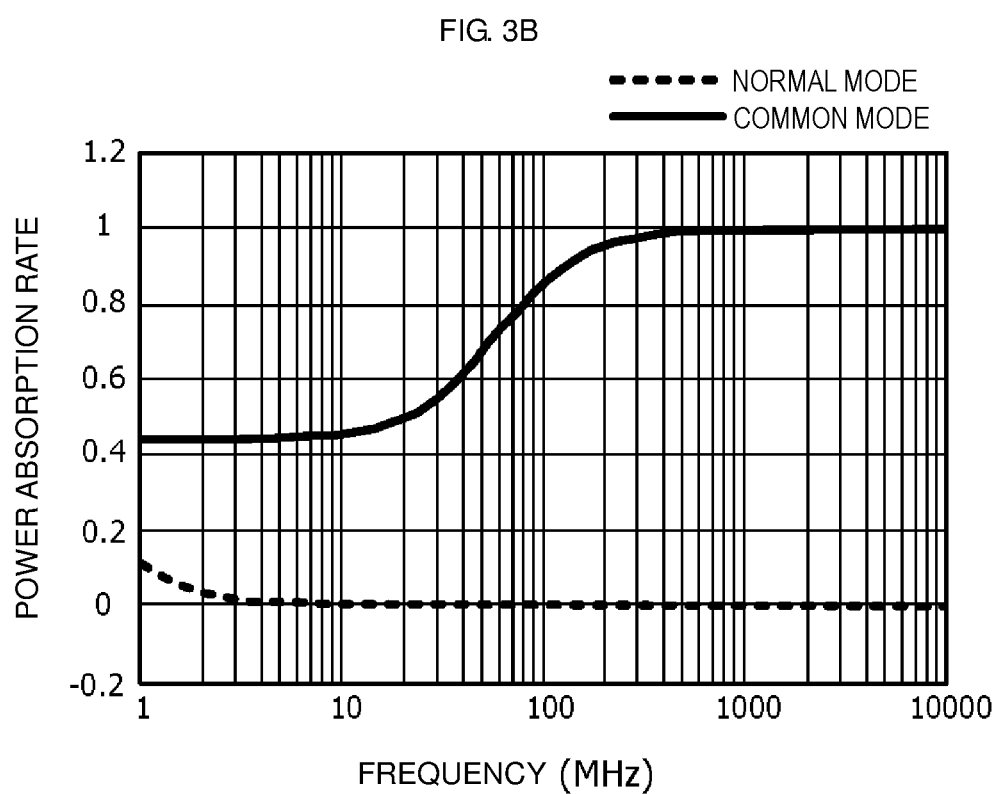

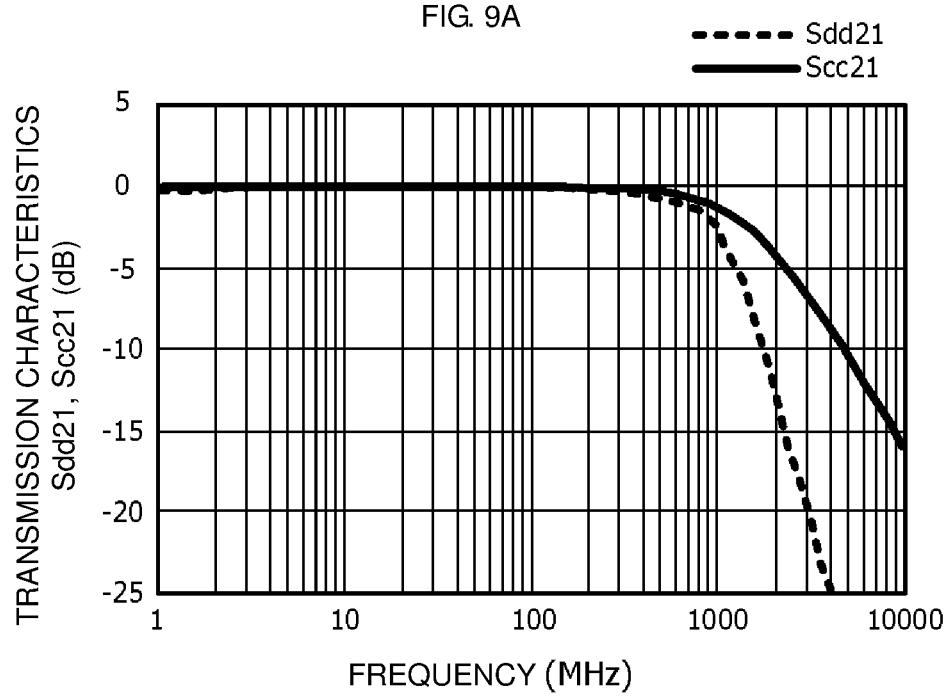
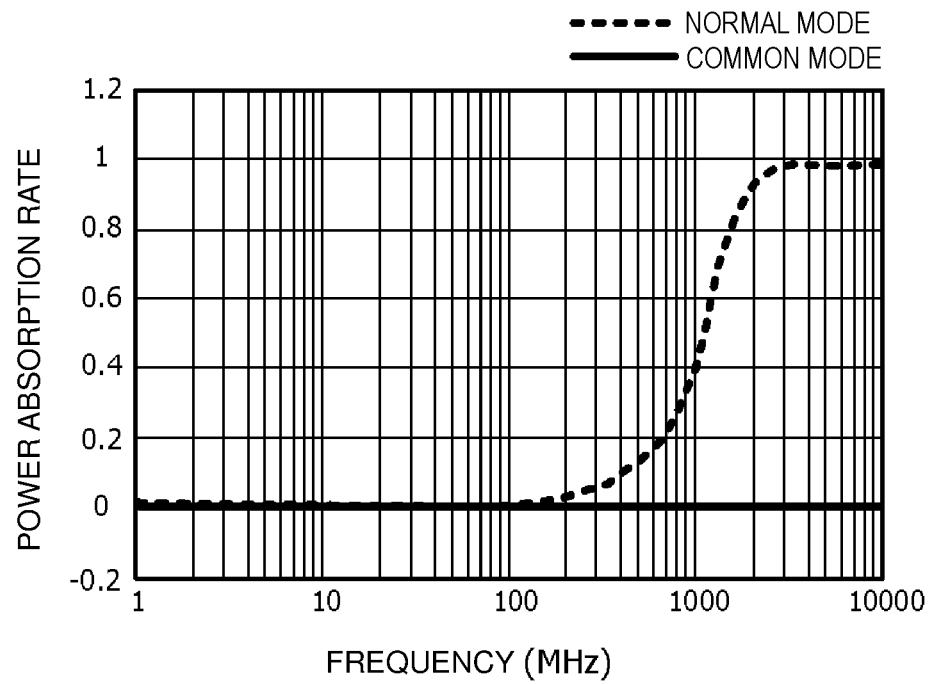

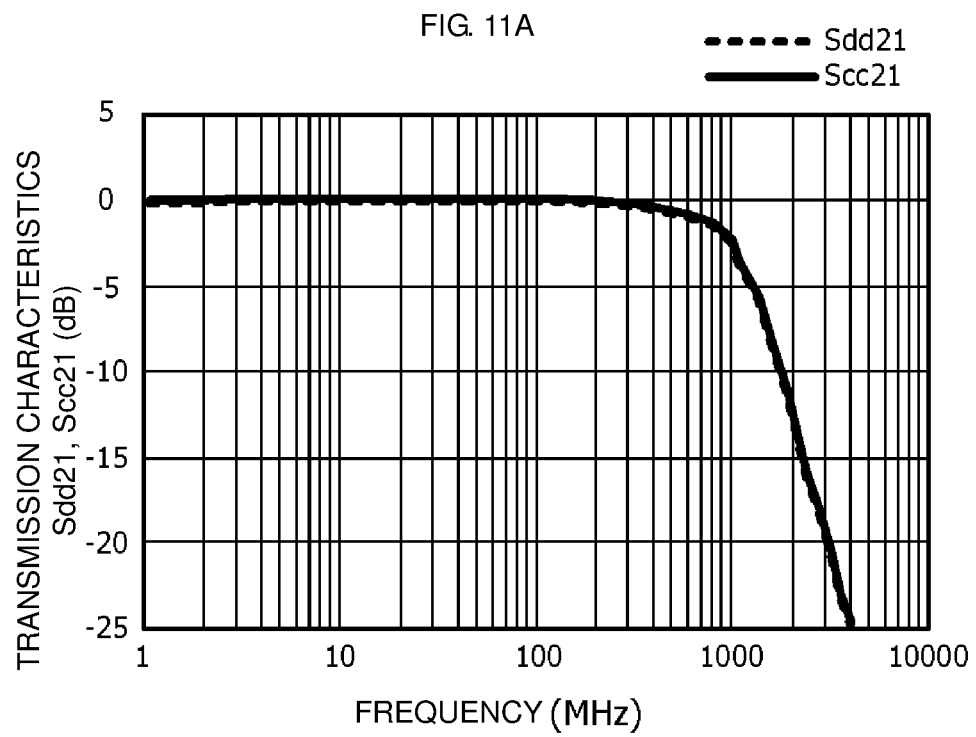
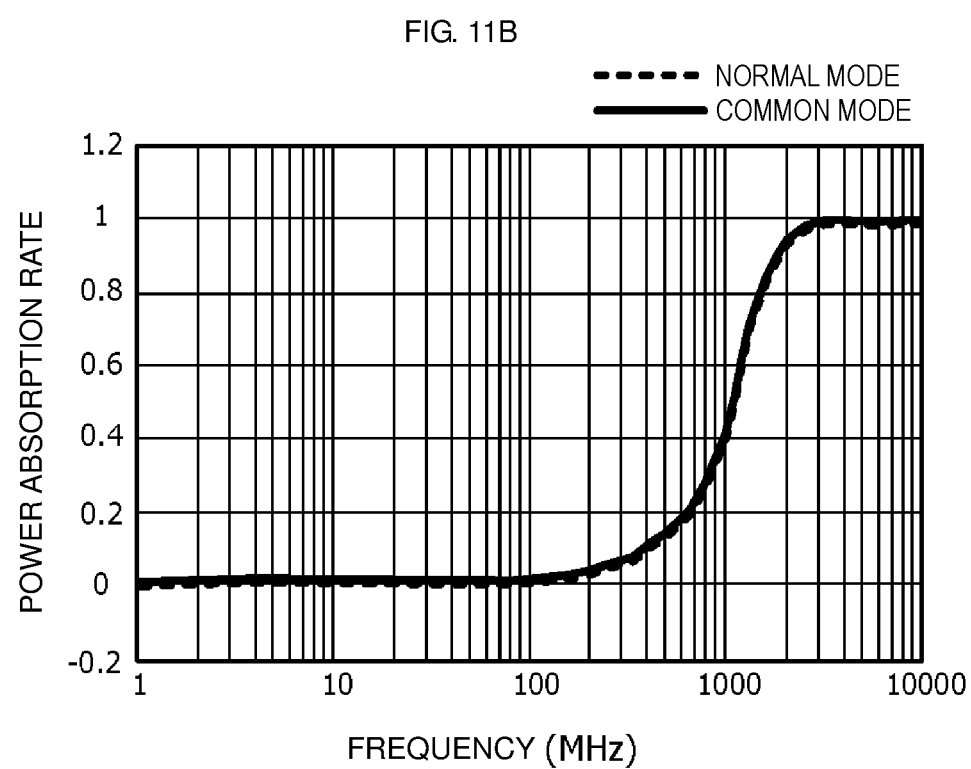

WIRELESS CIRCUIT-MOUNTED ELECTRONIC APPARATUS

CROSS REFERENCE TO RELATED APPLICATIONS

This application claims benefit of priority to Japanese Patent Application 2016-225747 filed Nov. 21, 2016, the entire content of which is incorporated herein by reference.

TECHNICAL FIELD

The present disclosure relates to an electronic apparatus in which a wireless circuit is mounted.

BACKGROUND

A filter transmitting a normal mode signal and absorbing common mode noise has been known (Japanese Unexamined Patent Application Publication Nos. 8-115820, 9-214276, and 2009-135760).

In the filter disclosed in Japanese Unexamined Patent Application Publication No. 8-115820, an input terminal and an output terminal of a first choke coil are connected to an input terminal and an output terminal of the filter, respectively. The first choke coil transmits a normal mode signal and blocks common mode noise. Furthermore, an input terminal of a second choke coil is connected to the input terminal of the filter. The second choke coil blocks the normal mode signal and transmits the common mode noise. Each of two output terminals of the second choke coil is grounded with a terminal resistor interposed therebetween. The terminal resistors convert energy of the common mode noise into heat for consumption.

In the filter disclosed in Japanese Unexamined Patent Application Publication No. 9-214276, a series circuit of a capacitor and a resistor is connected between input terminals thereof. In the filter, the resistor absorbs energy of a noise component that the filter does not transmit and converts it into heat energy for consumption.

The filter disclosed in Japanese Unexamined Patent Application Publication No. 2009-135760 is arranged in a shield case shielding an electronic apparatus main body including a signal generator. The electronic apparatus main body has ports for extracting, to the outside, a signal while passing through the shield case, and a common mode choke coil for radiation noise prevention, which is connected to a transmission line connecting the signal generator and the ports. The common mode choke coil is arranged in a substrate or a connector located at a position distanced from shield surfaces of the respective ports by less than about ¼ of a wavelength of a signal frequency at the inner side or the outer side of the shield surfaces, and a common mode impedance of the common mode choke coil is set to be equal to or larger than about 377Ω. This configuration reduces radiation noise to the outside of the shield case.

Japanese Unexamined Patent Application Publication Nos. 8-115820 and 9-214276 disclose a filter circuit in which the resistor converts energy of the noise component into heat for consumption but do not disclose a specific mounting position of the filter circuit and do not refer to an effective usage method thereof.

The electronic apparatus disclosed in Japanese Unexamined Patent Application Publication No. 2009-135760 can reduce the radiation noise by optimizing an insertion position of the common mode choke coil. The electronic apparatus cannot however provide a sufficient effect against a phenomenon called self-poisoning electromagnetic noise generated in the electronic apparatus that adversely influences other functions in the electronic apparatus.

SUMMARY

Accordingly, it is an object of the present disclosure to provide a wireless circuit-mounted electronic apparatus that reduces adverse influence on an external apparatus due to radiation noise and is difficult to cause self-poisoning.

According to a first preferred embodiment of the present disclosure, a wireless circuit-mounted electronic apparatus includes:

a signal transmission and reception element that transmits and receives a differential signal;

a connector that is connected to an external apparatus;

two transmission lines that transmit the differential signal between the signal transmission and reception element and the connector;

a noise generation source that generates noise in a wireless band, which is coupled to the transmission lines;

an antenna that has a gain in a frequency band of the noise which is generated in the noise generation source;

a wireless signal processing circuit that processes a signal received by the antenna; and an absorption-type filter that is mounted on the transmission lines and absorbs noise mixed in the transmission lines.

The absorption-type filter absorbs noise and noise coupled to the transmission lines from the noise generation source is therefore difficult to leak to the outside while passing through the connector. With this, electromagnetic radiation noise from a cable that is connected to the connector can be reduced. Furthermore, noise standing waves are difficult to be generated in the transmission lines connecting the signal transmission and reception element and the connector, thereby suppressing self-poisoning that electromagnetic noise radiated from the transmission lines in the apparatus coupled to the antenna of the apparatus.

In a wireless circuit-mounted electronic apparatus according to a second preferred embodiment of the present disclosure, it is preferable that an electric length of the transmission lines to the absorption-type filter from the signal transmission and reception element be equal to or larger than about ¼ of a wavelength of a signal having a highest frequency among wireless signals which are processed by the wireless signal processing circuit, in addition to the configuration of the wireless circuit-mounted electronic apparatus in the first preferred embodiment of the disclosure.

The configuration in which a reflection-type filter is mounted at an extremely close position to the signal transmission and reception element can effectively prevent adverse influence by noise leaking to the transmission lines from the signal transmission and reception element on other apparatuses. The noise coupled to the transmission lines from the noise generation source in the apparatus is however easy to leak to the outside while passing through the connector because an electric length from the reflection-type filter to the connector is increased.

The configuration in which the reflection-type filter is mounted at an extremely close position to the connector can provide an effect of suppressing leakage of the noise coupled to the transmission lines from the noise generation source in the apparatus to the outside while passing through the connector. Standing waves are however easy to be generated due to reflection, by the reflection-type filter, of the noise leaking to the transmission lines from the signal transmission and reception element and the noise coupled to the transmission lines from the noise generation source in the apparatus. As a result, the self-poisoning is easy to occur adversely. This phenomenon has not been known at the time when this application is filed and the inventors of the present application discovered it. When, for example, the electric length of the transmission lines to the filter from the signal transmission and reception element is equal to or larger than about ¼ of the wavelength of the signal having the highest frequency among the wireless signals which are processed by the wireless signal processing circuit, the self-poisoning is easy to occur in a frequency band in the vicinity of the frequency.

In the wireless circuit-mounted electronic apparatus according to the second preferred embodiment of the disclosure, not the reflection-type filter but the absorption-type filter is used. Therefore, even when the electric length of the transmission lines to the filter from the signal transmission and reception element is equal to or larger than about ¼ of the wavelength of the signal having the highest frequency among the wireless signals which are processed by the wireless signal processing circuit, the standing waves are difficult to be generated in the transmission lines. As a result, the self-poisoning is difficult to occur.

In a wireless circuit-mounted electronic apparatus according to a third preferred embodiment of the present disclosure, it is preferable that the electric length of the transmission lines to the absorption-type filter from the signal transmission and reception element be equal to or larger than about ¼ of a wavelength of a signal having a lowest frequency among the wireless signals which are processed by the wireless signal processing circuit, in addition to the configuration of the wireless circuit-mounted electronic apparatus in the second preferred embodiment of the disclosure.

The self-poisoning is difficult to occur in all of the frequency bands of the wireless signals which are processed by the wireless signal processing circuit.

In a wireless circuit-mounted electronic apparatus according to a fourth preferred embodiment of the present disclosure, it is preferable that the absorption-type filter include an absorption circuit which absorbs noise and a reflection circuit which reflects noise at a place at the connector side relative to the absorption circuit, in addition to the configuration of the wireless circuit-mounted electronic apparatus in any one of the first to third preferred embodiments of the disclosure.

The reflection circuit can further reduce noise leaking to the external apparatus while passing through the connector.

In a wireless circuit-mounted electronic apparatus according to a fifth preferred embodiment of the present disclosure, it is preferable that the absorption-type filter include:

a series circuit of a normal mode choke coil and a resistance element, which is mounted on the transmission lines in a shunt direction, and a common mode choke coil which is mounted on the transmission lines in series at the connector side relative to a shunt place, in addition to the configuration of the wireless circuit-mounted electronic apparatus in any one of the first to fourth preferred embodiments of the disclosure.

When common mode noise flows through the series circuit of the normal mode choke coil and the resistance element, the resistance element converts energy of the common mode noise into heat for consumption. The common mode choke coil reflects the common mode noise, thereby providing an effect of suppressing leakage of the common mode noise to the outside while passing through the connector.

In a wireless circuit-mounted electronic apparatus according to a sixth preferred embodiment of the present disclosure, it is preferable that the normal mode choke coil have capacitance components which are respectively mounted in parallel with two coils configuring the normal mode choke coil, self inductance components of the respective two coils configuring the normal mode choke coil and the capacitance components be set to such values that a cutoff frequency for a normal mode component of a signal which is transmitted through the transmission lines is higher than a frequency band of the differential signal which is transmitted through the transmission lines, in addition to the configuration of the wireless circuit-mounted electronic apparatus in the fifth preferred embodiment of the disclosure.

Normal mode noise in a high frequency band of equal to or higher than the cutoff frequency can be absorbed without substantially influencing the differential signal which is transmitted through the transmission lines. With this, occurrence of the self-poisoning due to the normal mode noise can be suppressed.

In a wireless circuit-mounted electronic apparatus according to a seventh preferred embodiment of the present disclosure, it is preferable that the absorption-type filter include a capacitor which connects the two transmission lines or capacitors which respectively connect the two transmission lines and the ground at the connector side relative to a place at which the normal mode choke coil is connected, in addition to the configuration of the wireless circuit-mounted electronic apparatus in the fifth or sixth preferred embodiment of the disclosure.

The capacitor which connects the two transmission lines reflects the normal mode noise, thereby providing an effect of suppressing leakage of the normal mode noise to the outside while passing through the connector. Alternatively, the capacitors which respectively connect the transmission lines and the ground reflect the common mode noise, thereby providing an effect of suppressing leakage of the common mode noise to the outside while passing through the connector.

In a wireless circuit-mounted electronic apparatus according to an eighth preferred embodiment of the present disclosure, it is preferable that the absorption-type filter include:

inductors which are respectively mounted on the two transmission lines in series; and a series circuit of a first capacitor and a resistance element, which is connected between the two transmission lines, at the signal transmission and reception element side relative to the inductors, in addition to the configuration of the wireless circuit-mounted electronic apparatus in any one of the first to fourth preferred embodiments of the disclosure.

The inductors function as low pass filters for the common mode component, thereby providing an effect of suppressing leakage of the common mode noise to the outside while passing through the connector. The inductors and the first capacitor function as low pass filters for the normal mode component, thereby providing an effect of suppressing leakage of the normal mode noise to the outside while passing through the connector. The resistance element connected in series to the first capacitor absorbs the normal mode noise, thereby suppressing reflection of the normal mode noise. With this, occurrence of the self-poisoning due to the normal mode noise can be suppressed.

In a wireless circuit-mounted electronic apparatus according to a ninth preferred embodiment of the present disclosure, it is preferable that the absorption-type filter further include a second capacitor which is connected between the two transmission lines at the connector side relative to the inductors, in addition to the configuration of the wireless circuit-mounted electronic apparatus in the eighth preferred embodiment of the disclosure.

Attenuation characteristics of the normal mode component of a signal can be made steep by connecting the second capacitor. With this, the effect of suppressing leakage of the normal mode noise to the outside while passing through the connector can be enhanced.

In a wireless circuit-mounted electronic apparatus according to a tenth preferred embodiment of the present disclosure, it is preferable that the absorption-type filter include:

inductors which are respectively mounted on the two transmission lines in series; and series circuits of first capacitors and resistance elements, which are respectively connected between the two transmission lines and the ground, at the signal transmission and reception element side relative to the inductors, in addition to the configuration of the wireless circuit-mounted electronic apparatus in any one of the first to fourth preferred embodiments of the disclosure.

The inductors and the first capacitors function as low pass filters for the common mode component and the normal mode component, thereby providing an effect of suppressing leakage of the common mode noise and the normal mode noise to the outside while passing through the connector. The resistance elements connected in series to the first capacitors absorb the common mode noise and the normal mode noise, thereby suppressing reflection of the common mode noise and the normal mode noise. With this, an effect of suppressing the self-poisoning due to the common mode noise and the normal mode noise can be provided.

In a wireless circuit-mounted electronic apparatus according to an eleventh preferred embodiment of the present disclosure, it is preferable that the absorption-type filter further include second capacitors which are respectively connected between the two transmission lines and the ground at the connector side relative to the inductors, in addition to the configuration of the wireless circuit-mounted electronic apparatus in the tenth preferred embodiment of the disclosure.

Attenuation characteristics of the common mode component and the normal mode component of a signal can be made steep by connecting the second capacitors. With this, the effect of suppressing leakage of the common mode noise and the normal mode noise to the outside while passing through the connector can be enhanced.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIG. 3A is a graph illustrating calculation results of normal mode component transmission characteristics Sdd21 and common mode component transmission characteristics Scc21 of an absorption-type filter that is used for the wireless circuit-mounted electronic apparatus in the first embodiment and FIG. 3B is a graph illustrating calculation results of power absorption rates of a normal mode component and a common mode component.

FIG. 9A is a graph illustrating calculation results of the normal mode component transmission characteristics Sdd21 and the common mode component transmission characteristics Scc21 of the absorption-type filter that is used for the wireless circuit-mounted electronic apparatus in the fourth embodiment and FIG. 9B is a graph illustrating calculation results of the power absorption rates of the normal mode component and the common mode component.

FIG. 11A is a graph illustrating calculation results of the normal mode component transmission characteristics Sdd21 and the common mode component transmission characteristics Scc21 of the absorption-type filter that is used for the wireless circuit-mounted electronic apparatus in the fifth embodiment and FIG. 11B is a graph illustrating calculation results of the power absorption rates of the normal mode component and the common mode component.

DETAILED DESCRIPTION

First Embodiment

A wireless circuit-mounted electronic apparatus according to a first embodiment will be described with reference to FIG. 1 to FIG. 3B.

Figure 1:
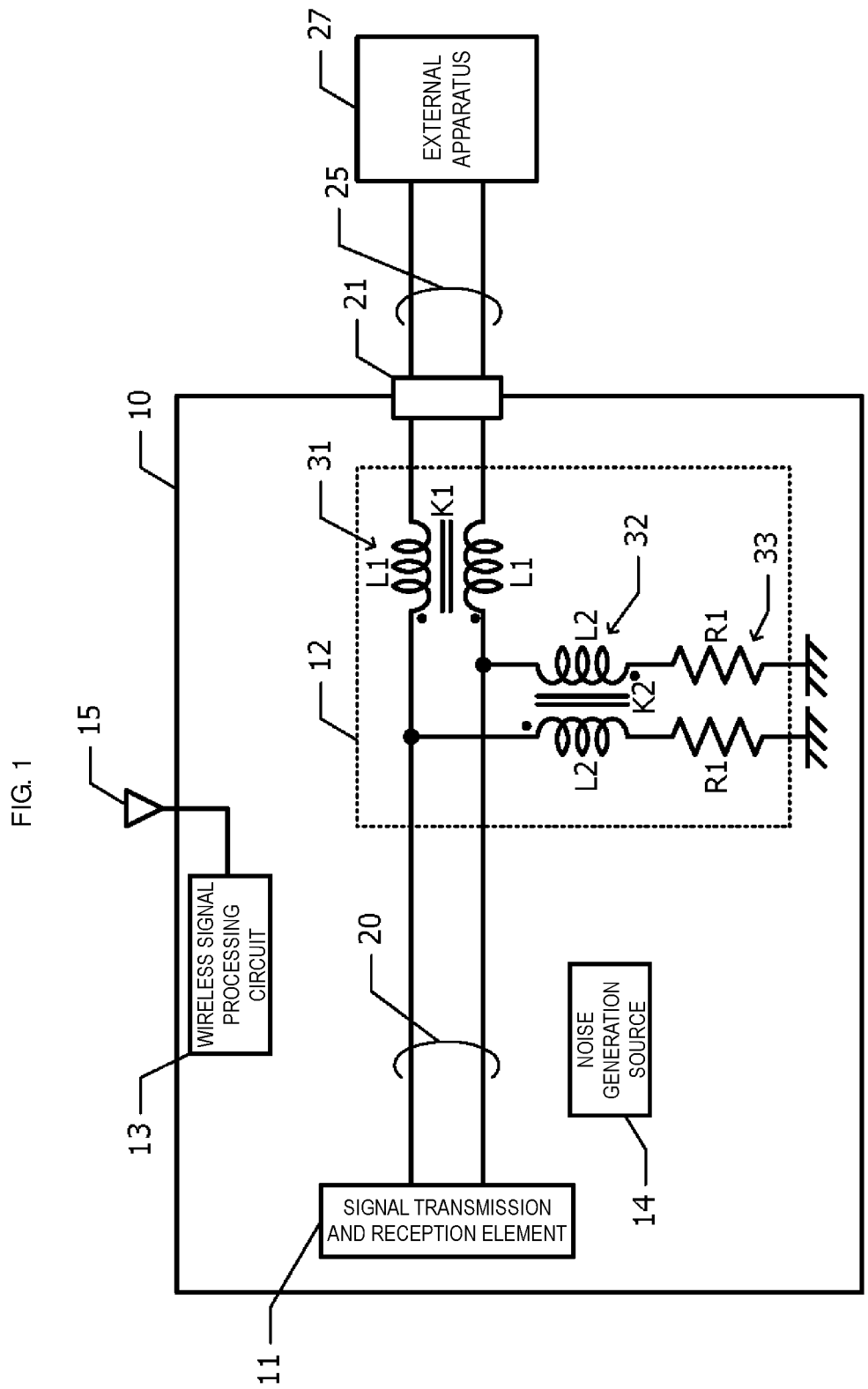
FIG. 1 is a schematic equivalent circuit diagram of a wireless circuit-mounted electronic apparatus according to a first embodiment.

FIG. 1 is a schematic equivalent circuit diagram of the wireless circuit-mounted electronic apparatus in the first embodiment. A signal transmission and reception element 11, an absorption-type filter 12, a wireless signal processing circuit 13, and a noise generation source 14 are accommodated in a shield case 10. An antenna 15 is connected to the wireless signal processing circuit 13 and the wireless signal processing circuit 13 transmits and receives a signal with the antenna 15 interposed therebetween.

A connector 21 including a plurality of ports for connecting transmission lines at the inner side and the outer side of the shield case 10 is provided in the shield case 10. The signal transmission and reception element 11 and the ports of the connector 21 are connected by two transmission lines 20. The absorption-type filter 12 is mounted on the two transmission lines 20 and has a function of absorbing noise mixed in the transmission lines 20.

The connector 21 is connected to an external apparatus with cables 25 interposed therebetween. Examples of the external apparatus 27 include an external storage device, a liquid crystal display, and the like. The signal transmission and reception element 11 transmits and receives a differential signal to and from the external apparatus 27 with the transmission lines 20 in the apparatus and the cables 25 at the outside of the apparatus interposed therebetween. The transmission lines 20 have a characteristic impedance satisfying the high-speed differential interface standards such as the USB and the HDMI (registered trademark), for example.

Examples of the noise generation source 14 include various circuits for implementing functions other than a function of controlling the external apparatus 27 by the signal transmission and reception element 11 and a function of making wireless communication by the wireless signal processing circuit 13, for example, a DC-to-DC converter, a clock signal generation circuit, and the like. When noise in a wireless band, which has been generated in the noise generation source 14, is coupled to the transmission lines 20, the noise is mixed in the transmission lines 20. The antenna 15 has a gain in a frequency band of the noise that is generated in the noise generation source 14.

The absorption-type filter 12 includes a common mode choke coil 31, a normal mode choke coil 32, and two resistance elements 33. The normal mode choke coil 32 is mounted on the transmission lines 20 in the shunt direction. The two resistance elements 33 are respectively connected in series to two coils configuring the normal mode choke coil 32.

The common mode choke coil 31 is mounted on the transmission lines 20 in series at the connector 21 side relative to a shunt place with the normal mode choke coil 32 on the transmission lines 20.

Common mode noise mixed in the transmission lines 20 flows to the ground with the normal mode choke coil 32 and the resistance elements 33 interposed therebetween. When the common mode noise flows through the resistance elements 33, energy of the common mode noise is converted into heat. Thus, the normal mode choke coil 32 and the resistance elements 33 have a function of absorbing the common mode noise. The common mode choke coil 31 has a function of reflecting the common mode noise.

Then, excellent effects of the first embodiment will be described with reference to FIG. 2A to FIG. 2D.

Figure 2A:
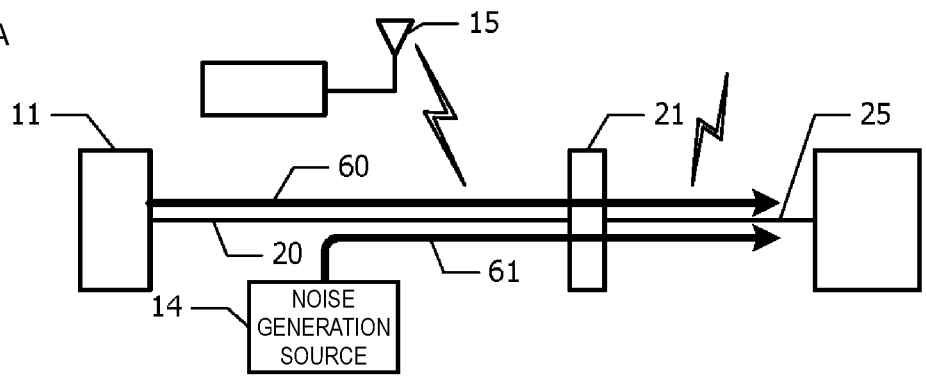
FIG. 2A is a schematic diagram in a comparative example having the configuration in which no filter is inserted into transmission lines of the wireless circuit-mounted electronic apparatus in the first embodiment.

FIG. 2A is a schematic diagram in a comparative example having the configuration in which no filter is inserted into the transmission lines 20 of the wireless circuit-mounted electronic apparatus in the first embodiment. Noise 60 generated in the signal transmission and reception element 11 is mixed in the transmission lines 20. Noise generated in the noise generation source 14 is coupled to the transmission lines 20, so that noise 61 is mixed in the transmission lines 20. The noise 60 and noise 61 leak to the cables 25 while passing through the connector 21.

When the noise 60 and noise 61 mixed in the transmission lines 20 are coupled to the antenna 15, self-poisoning occurs. The noise 60 and noise 61 mixed in the cables 25 cause electromagnetic radiation noise and adversely influence other apparatuses.

Figure 2B:
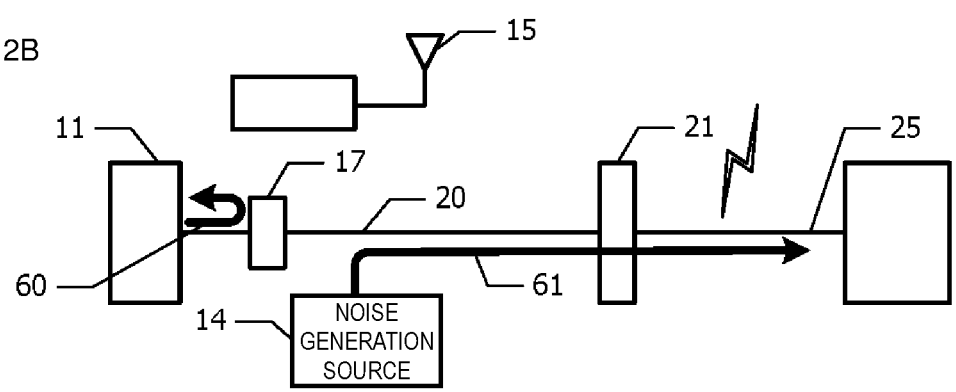
FIGS. 2B and 2C are schematic diagrams in comparative examples each having the configuration in which a reflection-type filter is inserted into the transmission lines of the wireless circuit-mounted electronic apparatus in the first embodiment.

FIG. 2B is a schematic diagram in a comparative example having the configuration in which a reflection-type filter 17 is inserted into the transmission lines 20 of the wireless circuit-mounted electronic apparatus in the first embodiment. In the comparative example, the reflection-type filter 17 is inserted at an extremely close position to the signal transmission and reception element 11. The noise 60 generated in the signal transmission and reception element 11 and mixed in the transmission lines 20 is reflected by the reflection-type filter 17. Therefore, substantially no component of the noise 60 is mixed in the transmission lines 20 at the connector 21 side relative to the place at which the reflection-type filter 17 is inserted.

The noise 61 is however mixed in the transmission lines 20 when the noise generated in the noise generation source 14 is coupled to the transmission lines 20. The noise 61 leaks to the cables 25 while passing through the connector 21.

In the comparative example illustrated in FIG. 2B, the self-poisoning due to the noise 60 hardly occurs because a section of the transmission lines 20 in which the noise 60 generated in the signal transmission and reception element 11 is mixed is short. Only the noise 61 generated in the noise generation source 14 can cause the self-poisoning and the self-poisoning is more difficult to occur than the comparative example illustrated in FIG. 2A. In the comparative example illustrated in FIG. 2B, an effect of reducing the electromagnetic radiation noise is small because the noise 61 leaks to the cables 25 while passing through the connector 21.

Figure 2C:
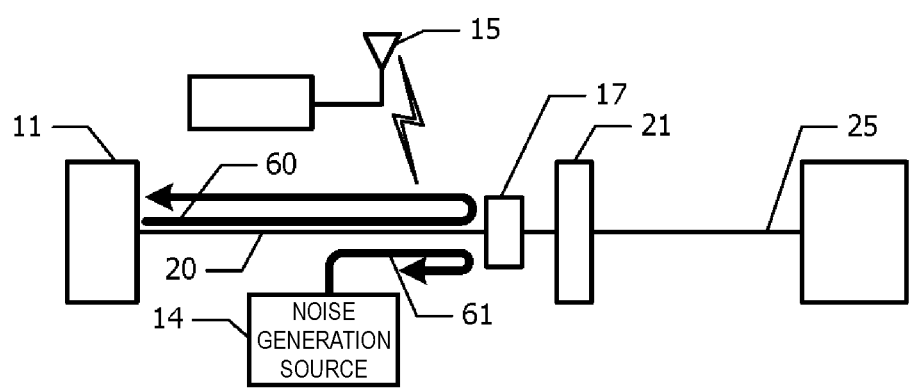

FIG. 2C is a schematic diagram in a comparative example having the configuration in which the reflection-type filter 17 is inserted into the transmission lines 20 of the wireless circuit-mounted electronic apparatus in the first embodiment. In the comparative example, the reflection-type filter 17 is inserted into an extremely close position to the connector 21. The noise 60 generated in the signal transmission and reception element 11 and the noise 61 generated in the noise generation source 14 are mixed in the transmission lines 20, and are reflected by the reflection-type filter 17. The reflected waves are larger than reflected waves by the connector 21 in the comparative example in FIG. 2A. Standing waves are generated with traveling waves flowing through the transmission lines 20 and the reflected waves. The self-poisoning is therefore easy to occur by insertion of the reflection-type filter 17. It should be noted that the effect of reducing the radiation noise is large.

The phenomenon that the self-poisoning becomes easy to occur by insertion of the reflection-type filter 17 has not been known at the time when this application is filed and the inventors of the present application discovered it.

Figure 2D:
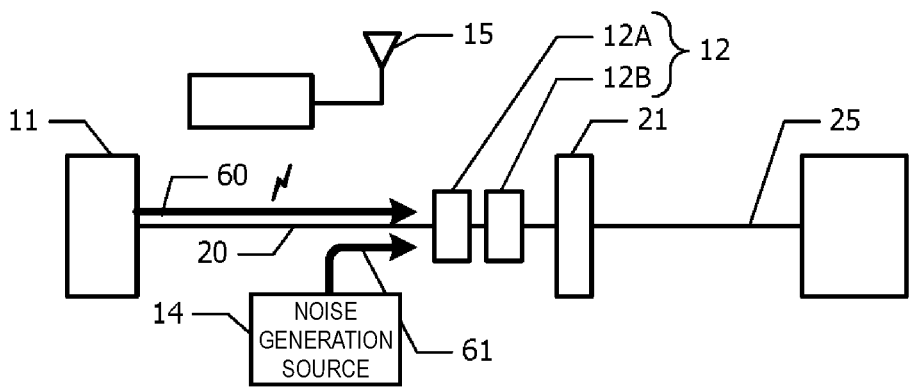
FIG. 2D is a schematic diagram of the wireless circuit-mounted electronic apparatus in the first embodiment.

FIG. 2D is a schematic diagram of the wireless circuit-mounted electronic apparatus in the first embodiment. The absorption-type filter 12 includes an absorption circuit 12A and a reflection circuit 12B. The absorption circuit 12A corresponds to a series circuit of the normal mode choke coil 32 and the resistance elements 33 (FIG. 1) and the reflection circuit 12B corresponds to the common mode choke coil 31 (FIG. 1). The reflection circuit 12B is inserted at the connector 21 side relative to the absorption circuit 12A and reflects noise at a place at the connector 21 side relative to a place at which the noise is absorbed.

The noise 60 generated in the signal transmission and reception element 11 and mixed in the transmission lines 20 and the noise 61 generated in the noise generation source 14 and mixed in the transmission lines 20 are absorbed by the absorption circuit 12A and reflection waves are therefore difficult to be generated. Accordingly, the standing waves with the traveling waves and the reflected waves are difficult to be generated, thereby providing an effect of suppressing the self-poisoning. Furthermore, the reflection circuit 12B acts in the same manner as the reflection-type filter 17 in the comparative example illustrated in FIG. 2C, thereby also providing the effect of suppressing generation of radiation noise.

Next, a result of simulation that was performed for checking the effects of the first embodiment will be described with reference to FIGS. 1, 3A, and 3B. As simulation conditions, self inductances L1 of the respective coils configuring the common mode choke coil 31 (FIG. 1) were set to about 100 nH and a coupling coefficient K1 thereof was set to about 0.99. Self inductances L2 of the respective coils configuring the normal mode choke coil 32 (FIG. 1) were set to about 10 μH and a coupling coefficient K2 thereof was set to about 1.00. Resistance values R1 of the respective resistance elements 33 were set to about 50Ω.

FIG. 3A is a graph illustrating calculation results of transmission characteristics Sdd21 of a normal mode component and transmission characteristics Scc21 of a common mode component of a signal that is transmitted. The transverse axis indicates a frequency by a unit of "MHz" and the longitudinal axis indicates the transmission characteristics Sdd21 and Scc21 by a unit of "dB". In FIG. 3A, a dashed line indicates the transmission characteristics Sdd21 of the normal mode component and a solid line indicates the transmission characteristics Scc21 of the common mode component.

It is seen that the normal mode component passes through the absorption-type filter 12 with substantially no attenuation. By contrast, it is seen that the common mode component is attenuated by the absorption-type filter 12 in a frequency band which is higher than a cutoff frequency.

FIG. 3B is a graph illustrating calculation results of the power absorption rates of the normal mode component and the common mode component. The power absorption rate herein indicates a rate of power absorbed by the absorption-type filter 12, of power input to the absorption-type filter 12. When reflection characteristics of the absorption-type filter 12 are expressed by S11 and the transmission characteristics thereof are expressed by S21, the power absorption rate Ap can be obtained by the following equation.

$$Ap = 1 - (S11^2 + S21^2)$$

In FIG. 3B, the transverse axis indicates the frequency by the unit of "MHz" and the longitudinal axis indicates the power absorption rate. In FIG. 3B, a dashed line indicates the power absorption rate of the normal mode component and a solid line indicates the power absorption rate of the common mode component.

It is seen that the normal mode component is hardly absorbed by the absorption-type filter 12. It is seen that the power absorption rate of the common mode component is equal to or higher than about 0.4 in all of the frequency bands and almost all of energy of the common mode component is absorbed in a frequency band of equal to or higher than about 400 MHz. With the absorption of the common mode component, reflection waves of the common mode component are not generated or are weakened.

As is seen from the above-described simulation, the absorption-type filter 12 that is used for the wireless circuit-mounted electronic apparatus in the first embodiment absorbs the common mode component and suppresses reflection. Furthermore, it was revealed that almost all of the normal mode component passes through the absorption-type filter 12.

Next, the electric length of the transmission lines 20 (FIG. 1) to the absorption-type filter 12 from the signal transmission and reception element 11 will be described. When the distance to the reflection-type filter 17 from the signal transmission and reception element 11 is short as illustrated in FIG. 2B, reflection does not cause the self-poisoning even when it occurs. When the distance to the reflection-type filter 17 from the signal transmission and reception element 11 is long as illustrated in FIG. 2C, the standing waves are generated due to the reflection waves and the self-poisoning is easy to occur.

When the electric length of the transmission lines 20 to the reflection-type filter 17 (FIG. 2C) from the signal transmission and reception element 11 is equal to or larger than about ¼ of the wavelength of noise in a frequency band of interest, electromagnetic radiation noise from the transmission lines 20 is increased. In other words, when the electric length of the transmission lines 20 to the reflection-type filter 12 (FIG. 2D) from the signal transmission and reception element 11 is equal to or larger than about ¼ of the wavelength of the noise in the frequency band of interest, a significant effect is provided by mounting the absorption-type filter 12.

In order to provide the significant effect of suppressing the self-poisoning in all of the frequency bands of wireless signals which are processed by the wireless signal processing circuit 13, it is preferable that the electric length of the transmission lines 20 to the absorption-type filter 12 from the signal transmission and reception element 11 be equal to or larger than about ¼ of a wavelength of a signal having the lowest frequency among the wireless signals which are processed by the wireless signal processing circuit 13. The electric length of the transmission lines 20 to the absorption-type filter 12 from the signal transmission and reception element 11 may be set to be equal to or larger than the wavelength of a signal in, in particular, a frequency band in which the self-poisoning is easy to occur. For example, when the self-poisoning is easy to occur with the wireless signal having the highest frequency among the wireless signals which are processed by the wireless signal processing circuit 13, it is preferable that the electric length of the transmission lines 20 to the absorption-type filter 12 from the signal transmission and reception element 11 be equal to or larger than about ¼ of a wavelength of the signal having the highest frequency among the wireless signals which are processed by the wireless signal processing circuit 13.

Then, a preferable range of the length to the normal mode choke coil 32 (FIG. 1) from a branch point of the transmission lines 20 will be described. The normal mode choke coil 32 reflects the normal mode component of a signal. Therefore, the lines to the normal mode choke coil 32 from the branch point of the transmission lines 20 act as open stubs for the normal mode component. The open stub causes mismatching in the characteristic impedance of the transmission lines 20. The mismatching in the characteristic impedance of the transmission lines 20 can be measured using a time domain reflectometry (TDR).

The differential interface standards such as the USB and the HDMI and the like define an allowable range of the characteristic impedance of a transmission line. For example, the USB standards require the characteristic impedance to be within about 90Ω±10% and the HDMI standards require the characteristic impedance to be within about 100Ω±15%. The length of the lines to the normal mode choke coil 32 from the branch point of the transmission lines 20 is preferably set such that the characteristic impedance of the transmission lines 20 does not deviate from the allowable range of the differential interface standards which are applied to communication between the signal transmission and reception element 11 and the external apparatus 27. In general, when the line length to the normal mode choke coil 32 from the branch point of the transmission lines 20 exceeds about 3 mm, the possibility that the differential interface standards are not satisfied is increased. In order to satisfy the differential interface standards, the line length is preferably set to be smaller than about 3 mm.

Second Embodiment

Next, a second embodiment will be described with reference to FIG. 4 to FIG. 5B. Hereinafter, description of common configurations to those in the first embodiment is omitted.

Figure 4:
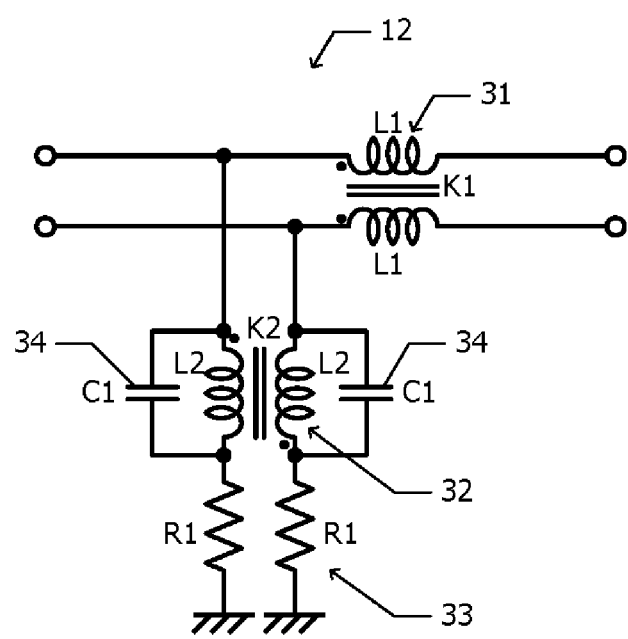
FIG. 4 is an equivalent circuit diagram of an absorption-type filter that is used for a wireless circuit-mounted electronic apparatus according to a second embodiment.

FIG. 4 is an equivalent circuit diagram of the absorption-type filter 12 that is used for a wireless circuit-mounted electronic apparatus in the second embodiment. In the second embodiment, capacitance components 34 that are respectively mounted in parallel with the two coils configuring the normal mode choke coil 32 are provided. The normal mode component of equal to or higher than a cutoff frequency which is determined by the self inductances L2 of the respective two coils configuring the normal mode choke coil 32 and capacitances C1 of the capacitance components 34 flows to the ground from the transmission lines 20. The cutoff frequency is set to be a value which is higher than an upper limit frequency of a frequency band of the differential signal that is transmitted through the transmission lines 20 (FIG. 1).

The capacitances C1 of the capacitance components 34 of the normal mode choke coil 32 can be adjusted by changing the numbers of winding, the shapes, the sizes, and the like of the coils. For example, when chip inductors used as the normal mode choke coil 32, the capacitances C1 of the capacitance components 34 can be increased by reducing distances between coils therein and external electrodes or increasing the external electrodes in size.

In the second embodiment, the normal mode component also flows to the ground after passing through the capacitance components 34 of the normal mode choke coil 32 and the resistance elements 33. Therefore, normal mode noise of equal to or higher than the cutoff frequency can be absorbed. With this, occurrence of the self-poisoning and the electromagnetic radiation noise due to noise having the normal mode component can be suppressed. The cutoff frequency is set to be a value which is higher than the upper limit frequency of the frequency band of the differential signal that is transmitted through the transmission lines 20 (FIG. 1) and the differential signal that is transmitted through the transmission lines 20 is not therefore influenced by the absorption-type filter 12.

Next, a result of simulation that was performed for checking the effects of the second embodiment will be described with reference to FIGS. 5A and 5B. As simulation conditions, a coupling coefficient K1 of the common mode choke coil 31 (FIG. 4) was set to about 0.9 and the capacitances C1 were set to about 3 pF. Other circuit constants were set to the same as those of the simulation conditions in the first embodiment illustrated in FIG. 3A and FIG. 3B.

Figure 5A:
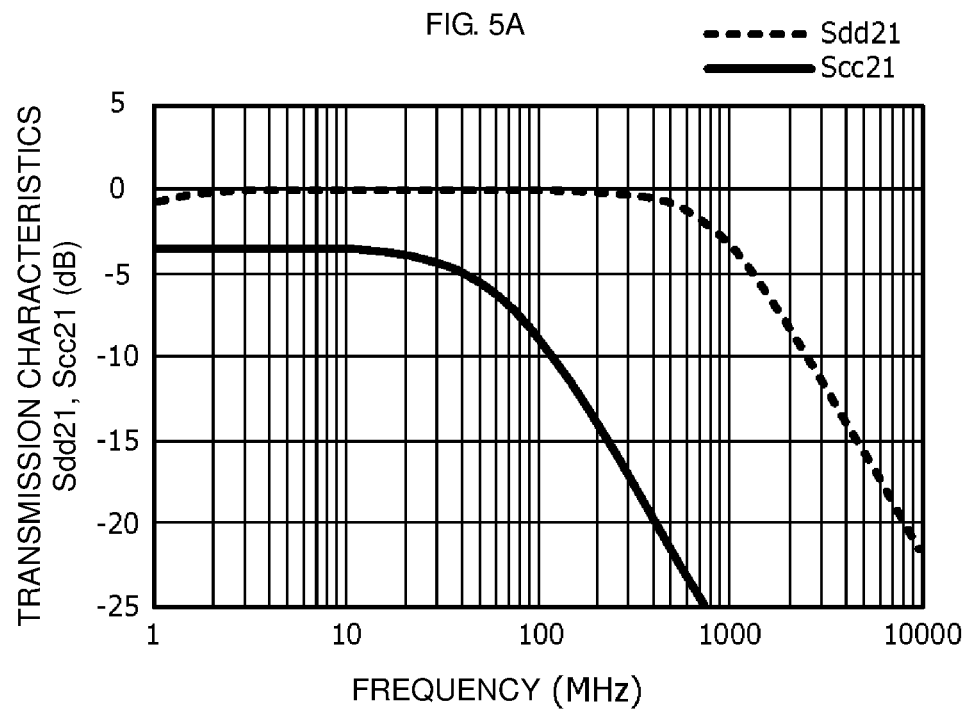
FIG. 5A is a graph illustrating calculation results of the normal mode component transmission characteristics Sdd21 and the common mode component transmission characteristics Scc21 of the absorption-type filter that is used for the wireless circuit-mounted electronic apparatus in the second embodiment and FIG. 5B is a graph illustrating calculation results of the power absorption rates of the normal mode component and the common mode component.
Figure 5B:
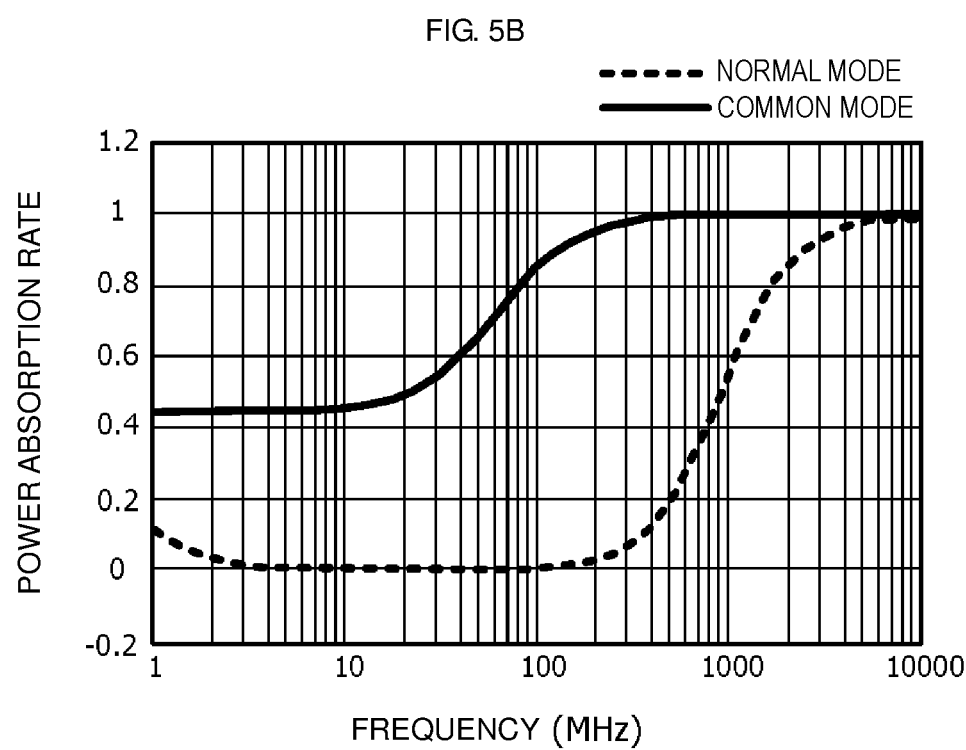

FIG. 5A and FIG. 5B are graphs illustrating the transmission characteristics and the power absorption rates of the absorption-type filter 12 that is used in the second embodiment and correspond to FIG. 3A and FIG. 3B in the first embodiment, respectively. The transmission characteristics Scc21 and the power absorption rate of the common mode component in the second embodiment are substantially identical to the transmission characteristics Scc21 and the power absorption rate of the common mode component illustrated in FIG. 3A and FIG. 3B in the first embodiment, respectively.

In the second embodiment, as illustrated in FIG. 5A, it is seen that the transmission characteristics Sdd21 of the normal mode component is decreased in a high frequency band of equal to or higher than the cutoff frequency (about 1 GHz). Furthermore, as illustrated in FIG. 5B, it is seen that the power absorption rate of the normal mode component is increased in the high frequency band of equal to or higher than about 1 GHz.

As illustrated in FIG. 5A and FIG. 5B, the wireless circuit-mounted electronic apparatus in the second embodiment is effective for not only a countermeasure against the noise having the common mode component but also a countermeasure against the noise having the normal mode component.

Third Embodiment

A third embodiment will be described with reference to FIG. 6 to FIG. 7B. Hereinafter, description of common configurations to those in the second embodiment is omitted.

Figure 6:
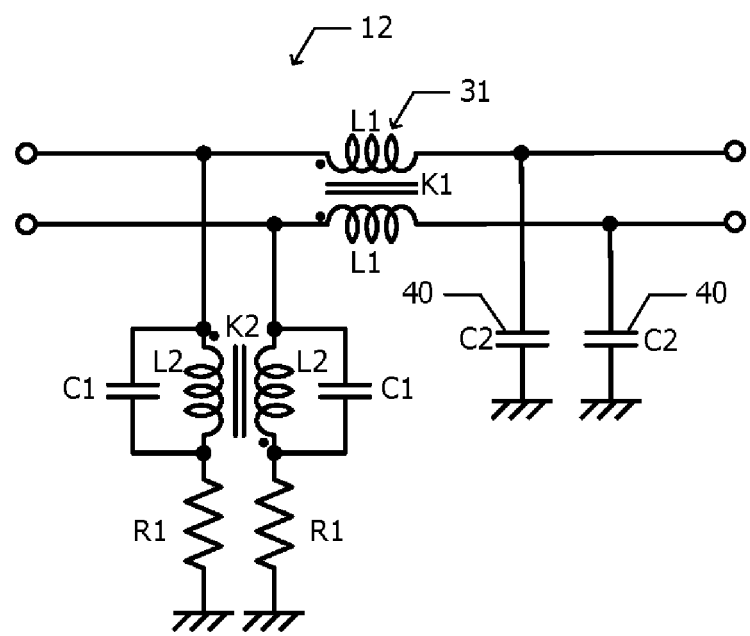
FIG. 6 is an equivalent circuit diagram of an absorption-type filter that is used for a wireless circuit-mounted electronic apparatus according to a third embodiment.

FIG. 6 is an equivalent circuit diagram of the absorption-type filter 12 that is used for a wireless circuit-mounted electronic apparatus in the third embodiment. In the third embodiment, capacitors 40 respectively connect the two transmission lines 20 at the connector 21 (FIG. 1) side relative to the common mode choke coil 31 and the ground. The capacitors 40 connected in this manner are referred to as Y capacitors, in general. The capacitors 40 cause the normal mode component in a high frequency band of equal to or higher than the cutoff frequency, which has passed through the common mode choke coil 31, to flow to the ground. Therefore, attenuation characteristics of the normal mode component can be made steeper than those in the second embodiment (FIG. 4).

Next, a result of simulation that was performed for checking the effects of the third embodiment will be described with reference to FIGS. 7A and 7B. As simulation conditions, capacitances C2 of the capacitors 40 were set to about 3 pF. Other circuit constants were set to the same as those of the simulation conditions in the second embodiment illustrated in FIG. 5A and FIG. 5B.

Figure 7A:
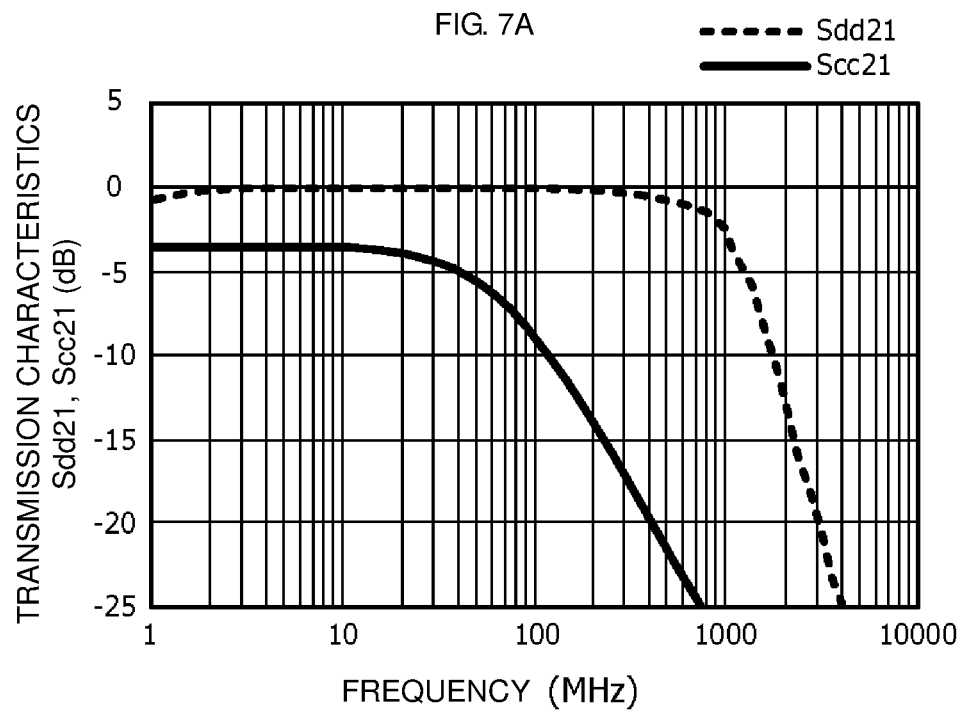
FIG. 7A is a graph illustrating calculation results of the normal mode component transmission characteristics Sdd21 and the common mode component transmission characteristics Scc21 of the absorption-type filter that is used for the wireless circuit-mounted electronic apparatus in the third embodiment and FIG. 7B is a graph illustrating calculation results of the power absorption rates of the normal mode component and the common mode component.
Figure 7B:
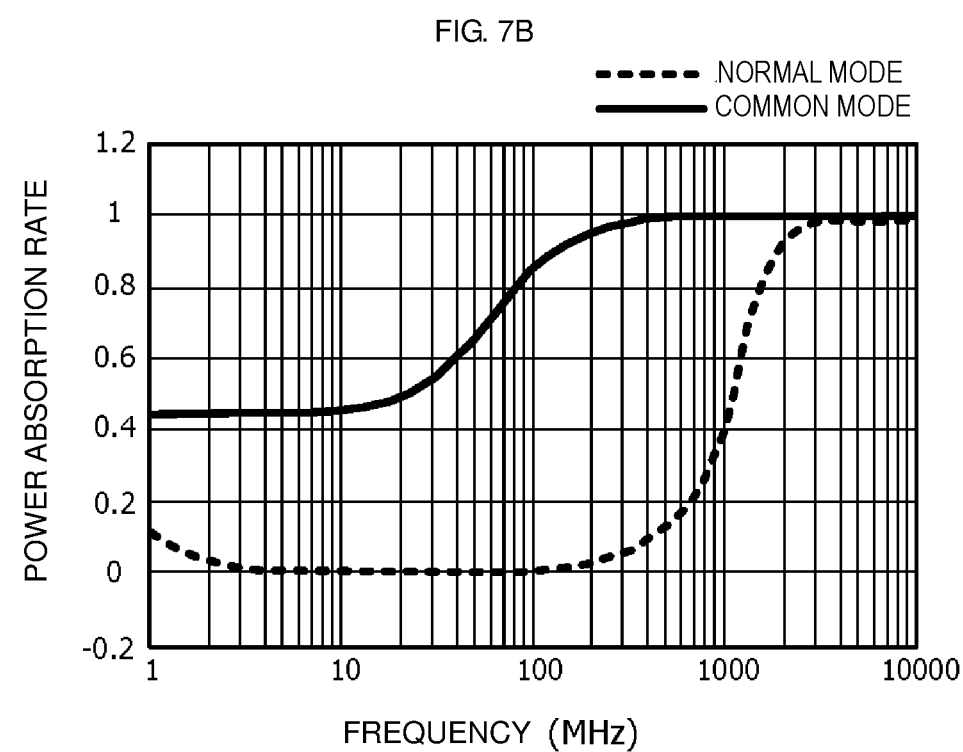

FIG. 7A and FIG. 7B are graphs illustrating the absorption characteristics and the power absorption rates of the absorption-type filter 12 that is used in the third embodiment and correspond to FIG. 5A and FIG. 5B in the second embodiment, respectively. The transmission characteristics Scc21 and the power absorption rate of the common mode component in the third embodiment are substantially identical to the transmission characteristics Scc21 and the power absorption rate of the common mode component illustrated in FIG. 5A and FIG. 5B in the second embodiment, respectively.

In the third embodiment, as illustrated in FIG. 7A, it is seen that the attenuation characteristics of the normal mode component are steeper than the attenuation characteristics (FIG. 5A) of the normal mode component in the second embodiment. Furthermore, it is seen that variation in the power absorption rate of the normal mode component relative to variation in the frequency is also steeper than the variation in the power absorption rate (FIG. 5B) in the second embodiment.

As illustrated in FIG. 7A and FIG. 7B, the wireless circuit-mounted electronic apparatus in the third embodiment is effective for not only a countermeasure against the noise having the common mode component but also a countermeasure against the noise having the normal mode component. Furthermore, the attenuation characteristics of noise having the normal mode component can be made steeper than those in the second embodiment.

Although in the third embodiment, the capacitors 40 are respectively inserted between the two transmission lines 20 and the ground, the two transmission lines 20 may be connected by a capacitor. The capacitor is referred to as an X capacitor, in general. The X capacitor can also make the attenuation characteristics of the normal mode component steep.

Fourth Embodiment

A fourth embodiment will be described with reference to FIG. 8 to FIG. 9B. Hereinafter, description of common configurations to those in the first embodiment is omitted. Although the absorption-type filter is configured by the common mode choke coil 31 and the normal mode choke coil 32 in the first embodiment, an LC filter is used as the absorption-type filter in the fourth embodiment.

Figure 8:
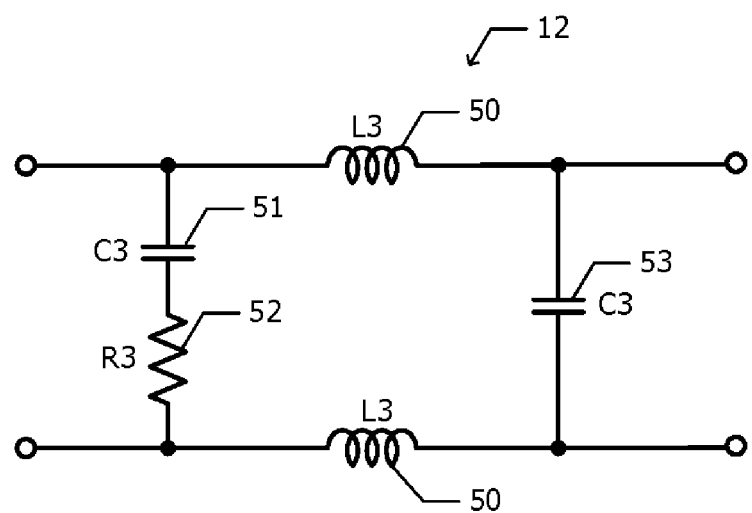
FIG. 8 is an equivalent circuit diagram of an absorption-type filter that is used for a wireless circuit-mounted electronic apparatus according to a fourth embodiment.

FIG. 8 is an equivalent circuit diagram of the absorption-type filter 12 that is used for a wireless circuit-mounted electronic apparatus in the fourth embodiment. The absorption-type filter 12 that is used for the wireless circuit-mounted electronic apparatus in the fourth embodiment includes two inductors 50, a series circuit of a first capacitor 51 and a resistance element 52, and a second capacitor 53. The two inductors 50 are respectively mounted on the two transmission lines (FIG. 1) in series. The series circuit of the first capacitor 51 and the resistance element 52 is connected between the two transmission lines 20 at the signal transmission and reception element 11 side relative to the inductors 50. The second capacitor 53 is connected between the two transmission lines 20 at the connector 21 side relative to the inductors 50.

The circuit constants of the inductors 50, the first capacitor 51, the resistance element 52, and the second capacitor 53 are set such that the cutoff frequency of the absorption-type filter 12 is a value giving no influence on transmission of the differential signal which is transmitted through the transmission lines 20.

FIG. 9A and FIG. 9B are graphs illustrating transmission characteristics and the power absorption rate of the absorption-type filter 12 that is used in the fourth embodiment and correspond to FIG. 3A and FIG. 3B in the first embodiment, respectively. As simulation conditions, inductances L3 of the inductors 50 were set to about 10 nH, capacitances C3 of the first capacitor 51 and the second capacitor 53 were set to about 1.5 pF, and a resistance value R3 of the resistance element 52 was set to about 100Ω.

The transmission characteristics Sdd21 of the normal mode component is decreased in a high frequency band of equal to or higher than the cutoff frequency. The inclination of the transmission characteristics Sdd21 is steep and is substantially the same degree as that of the transmission characteristics Sdd21 (FIG. 7A) in the third embodiment. The transmission characteristics Scc21 of the common mode component is moderately decreased in the high frequency band of equal to or higher than the cutoff frequency. The difference between the normal mode component and the common mode component is generated because the first capacitor 51 and the second capacitor 53 do not function as capacitors for the common mode component.

The power absorption rate of the common mode component is substantially 0 in all of the frequency bands and the power thereof is not absorbed. The power absorption rate of the normal mode component is increased in the high frequency band of equal to or higher than the cutoff frequency, and the power absorption rate is substantially 1 in a high frequency band of equal to or higher than about 3 GHz. That is to say, almost all the power thereof is absorbed.

The inductors 50 function as low pass filters for the common mode component, thereby providing an effect of suppressing leakage of the common mode noise to the outside while passing through the connector 21. The inductors 50 and the first capacitor 51 function as low pass filters for the normal mode component, thereby providing an effect of suppressing leakage of the normal mode noise to the outside while passing through the connector 21. The resistance element 52 connected in series to the first capacitor 51 absorbs power of the normal mode noise, thereby reducing reflection of the normal mode noise. With this, occurrence of the self-poisoning due to the normal mode noise can be suppressed.

Attenuation characteristics of the normal mode component can be made steep by connecting the second capacitor 53. With this, the effect of suppressing leakage of the normal mode noise to the outside while passing through the connector can be enhanced. It should be noted that the second capacitor 53 may be omitted.

Fifth Embodiment

Next, a fifth embodiment will be described with reference to FIG. 10 to FIG. 11B. Hereinafter, description of common configurations to those in the fourth embodiment is omitted. Although in the fourth embodiment, the so-called X capacitors that are connected between the two transmission lines are used, the so-called Y capacitors are used in the fifth embodiment.

Figure 10:
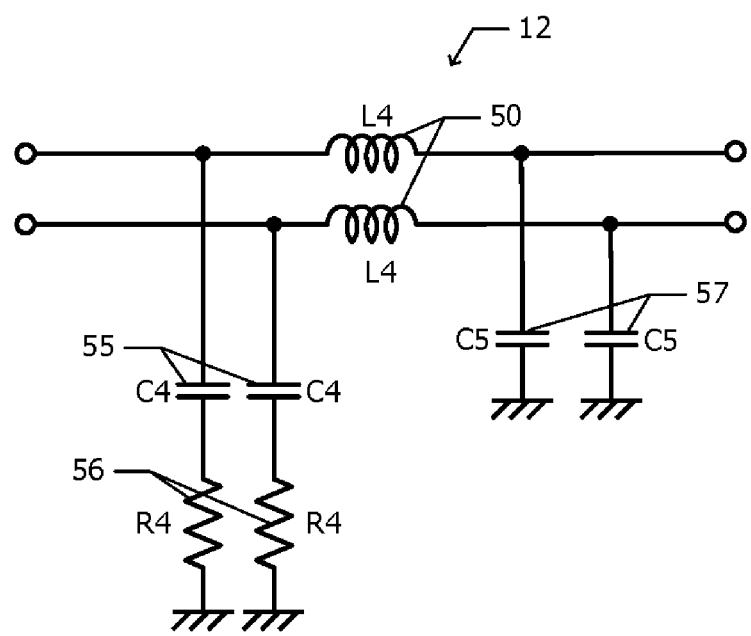
FIG. 10 is an equivalent circuit diagram of an absorption-type filter that is used for a wireless circuit-mounted electronic apparatus according to a fifth embodiment.

FIG. 10 is an equivalent circuit diagram of the absorption-type filter 12 that is used for a wireless circuit-mounted electronic apparatus in the fifth embodiment. The absorption-type filter 12 that is used for the wireless circuit-mounted electronic apparatus in the fifth embodiment includes the two inductors 50, two series circuits of first capacitors 55 and resistance elements 56, and two second capacitors 57. The two inductors 50 are respectively mounted on the two transmission lines (FIG. 1) in series. The two series circuits of the first capacitors 55 and the resistance elements 56 are respectively connected between the two transmission lines 20 and the ground at the signal transmission and reception element 11 side relative to the inductors 50. The two second capacitors 57 are respectively connected between the two transmission lines 20 and the ground at the connector 21 side relative to the inductors 50.

The circuit constants of the inductors 50, the first capacitors 55, the resistance elements 56, and the second capacitors 57 are set such that the cutoff frequency of the absorption-type filter 12 is a value giving no influence on transmission of the differential signal which is transmitted through the transmission lines 20.

FIG. 11A and FIG. 11B are graphs illustrating transmission characteristics and power absorption rates of the absorption-type filter 12 that is used in the fifth embodiment and correspond to FIG. 9A and FIG. 9B in the fourth embodiment, respectively. As simulation conditions, inductances L4 of the inductors 50 were set to about 10 nH, capacitances C4 of the first capacitors 55 and the second capacitors 57 were set to about 3 pF, and resistance values R4 of the resistance elements 56 were set to about 50Ω.

Both of the transmission characteristics Sdd21 of the normal mode component and the transmission characteristics Scc21 of the common mode component are decreased steeply in a high frequency band of equal to or higher than the cutoff frequency. Both of the power absorption rate of the normal mode component and the power absorption rate of the common mode component are increased in the high frequency band of equal to or higher than the cutoff frequency, and the power absorption rate is substantially 1 in a high frequency band of equal to or higher than about 3 GHz. That is to say, almost all the power thereof is absorbed.

In the fifth embodiment, effects of suppressing leakage and reflection of noise having the common mode component can be enhanced in comparison with the fourth embodiment.

It is needless to say that the respective embodiments as described above are exemplary and partial replacement or combination of components in different embodiments can be made. The same action effects with the same configurations in the plurality of embodiments are not referred in each embodiment. Moreover, the present disclosure is not limited by the above-described embodiments. For example, it would be obvious to those skilled in the art that various changes, improvements, combinations, and the like can be made.

Advantages

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A wireless circuit-mounted electronic apparatus comprising:
    a signal transmitter and receiver that transmits and receives a differential signal;
    a connector that is connected to an external apparatus;
    two transmission lines that transmit the differential signal between the signal transmitter and receiver and the connector;
    a noise generation source that generates noise in a wireless band, which is coupled to the transmission lines;
    an antenna that has a gain in a frequency band of the noise which is generated in the noise generation source;
    a wireless signal processing circuit that processes a signal received by the antenna; and
    a passive absorption-type filter that is mounted on the transmission lines and includes a common mode choke coil having a self inductance and a coupling coefficient that are fixed over an entirety of the wireless band of the noise generated by the noise generation source to enable the passive absorption-type filter to absorb the noise generated by the noise generation source that is mixed in the transmission lines such that a normal mode component of the differential signal passes through the passive absorption-type filter and a common mode component of the differential signal is attenuated by the passive absorption-type filter in a frequency band which is higher than a cutoff frequency, and the noise generated by the noise generation source is different from noise generated by the wireless signal processing circuit,
    the passive absorption-type filter further including a normal mode choke coil, which is mounted on the transmission lines in a shunt direction, such that a line length from a branch point of the transmission lines to the normal mode choke coil is less than 3 mm.

2. The wireless circuit-mounted electronic apparatus according to claim 1,
    wherein an electric length of the transmission lines to the passive absorption-type filter from the signal transmitter and receiver is equal to or larger than about ¼ of a wavelength of a signal having a highest frequency among wireless signals which are processed by the wireless signal processing circuit.

3. The wireless circuit-mounted electronic apparatus according to claim 2,
    wherein the electric length of the transmission lines to the passive absorption-type filter from the signal transmitter and receiver is equal to or larger than about ¼ of a wavelength of a signal having a lowest frequency among the wireless signals which are processed by the wireless signal processing circuit.

4. The wireless circuit-mounted electronic apparatus according to claim 1,
    wherein the passive absorption-type filter includes an absorption circuit which absorbs noise and a reflection circuit which reflects noise at a place at the connector side relative to the absorption circuit.

5. The wireless circuit-mounted electronic apparatus according to claim 1,
    wherein the passive absorption-type filter includes:
        a series circuit of the normal mode choke coil and a resistance element, which is mounted on the transmission lines in the shunt direction, and
        a common mode choke coil which is mounted on the transmission lines in series at the connector side relative to a shunt place.

6. The wireless circuit-mounted electronic apparatus according to claim 5,
    wherein the normal mode choke coil has capacitance components which are respectively mounted in parallel with two coils configuring the normal mode choke coil, and self inductance components of the respective two coils configuring the normal mode choke coil and the capacitance components are set to such values that a cutoff frequency for a normal mode component of a signal which is transmitted through the transmission lines is higher than a frequency band of the differential signal which is transmitted through the transmission lines.

7. The wireless circuit-mounted electronic apparatus according to claim 5,
    wherein the passive absorption-type filter further includes a capacitor which connects the two transmission lines or capacitors which respectively connect the two transmission lines and the ground at the connector side relative to a place at which the normal mode choke coil is connected.

8. The wireless circuit-mounted electronic apparatus according to claim 1,
wherein the passive absorption-type filter includes:
inductors which are respectively mounted on the two transmission lines in series; and
a series circuit of a first capacitor and a resistance element, which is connected between the two transmission lines, at the signal transmitter and receiver side relative to the inductors.

9. The wireless circuit-mounted electronic apparatus according to claim 8,
wherein the passive absorption-type filter further includes a second capacitor which is connected between the two transmission lines at the connector side relative to the inductors.

10. The wireless circuit-mounted electronic apparatus according to claim 1,
wherein the passive absorption-type filter includes:
inductors which are respectively mounted on the two transmission lines in series; and
series circuits of first capacitors and resistance elements, which are respectively connected between the two transmission lines and the ground, at the signal transmitter and receiver side relative to the inductors.

11. The wireless circuit-mounted electronic apparatus according to claim 10,
wherein the passive absorption-type filter further includes second capacitors which are respectively connected between the two transmission lines and the ground at the connector side relative to the inductors.

12. The wireless circuit-mounted electronic apparatus according to claim 2,
wherein the passive absorption-type filter includes an absorption circuit which absorbs noise and a reflection circuit which reflects noise at a place at the connector side relative to the absorption circuit.

13. The wireless circuit-mounted electronic apparatus according to claim 3,
wherein the passive absorption-type filter includes an absorption circuit which absorbs noise and a reflection circuit which reflects noise at a place at the connector side relative to the absorption circuit.

14. The wireless circuit-mounted electronic apparatus according to claim 2,
wherein the passive absorption-type filter includes:
a series circuit of the normal mode choke coil and a resistance element, which is mounted on the transmission lines in the shunt direction, and
a common mode choke coil which is mounted on the transmission lines in series at the connector side relative to a shunt place.

15. The wireless circuit-mounted electronic apparatus according to claim 4,
wherein the passive absorption-type filter includes:
a series circuit of the normal mode choke coil and a resistance element, which is mounted on the transmission lines in the shunt direction, and
a common mode choke coil which is mounted on the transmission lines in series at the connector side relative to a shunt place.

16. The wireless circuit-mounted electronic apparatus according to claim 6,
wherein the passive absorption-type filter further includes a capacitor which connects the two transmission lines or capacitors which respectively connect the two transmission lines and the ground at the connector side relative to a place at which the normal mode choke coil is connected.

17. The wireless circuit-mounted electronic apparatus according to claim 2,
wherein the passive absorption-type filter includes:
inductors which are respectively mounted on the two transmission lines in series; and
a series circuit of a first capacitor and a resistance element, which is connected between the two transmission lines, at the signal transmitter and receiver side relative to the inductors.

18. The wireless circuit-mounted electronic apparatus according to claim 4,
wherein the passive absorption-type filter includes:
inductors which are respectively mounted on the two transmission lines in series; and
a series circuit of a first capacitor and a resistance element, which is connected between the two transmission lines, at the signal transmitter and receiver side relative to the inductors.

19. The wireless circuit-mounted electronic apparatus according to claim 2,
wherein the passive absorption-type filter includes:
inductors which are respectively mounted on the two transmission lines in series; and
series circuits of first capacitors and resistance elements, which are respectively connected between the two transmission lines and the ground, at the signal transmitter and receiver side relative to the inductors.

20. The wireless circuit-mounted electronic apparatus according to claim 4,
wherein the passive absorption-type filter includes:
inductors which are respectively mounted on the two transmission lines in series; and
series circuits of first capacitors and resistance elements, which are respectively connected between the two transmission lines and the ground, at the signal transmitter and receiver side relative to the inductors.

* * * * *